US006995410B2

(12) United States Patent
Hosono et al.

(10) Patent No.: US 6,995,410 B2
(45) **Date of Patent: *Feb. 7, 2006**

(54) NAND FLASH MEMORY WITH UNEQUAL SPACING BETWEEN SIGNAL LINES

(75) Inventors: Koji Hosono, Yokohama (JP); Hiroshi Nakamura, Fujisawa (JP); Kenichi Imamiya, Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 10/664,538

(22) Filed: Sep. 19, 2003

(65) Prior Publication Data

US 2004/0079970 A1 Apr. 29, 2004

Related U.S. Application Data

(63) Continuation of application No. 10/274,438, filed on Oct. 18, 2002, now Pat. No. 6,649,945.

(30) Foreign Application Priority Data

Aug. 20, 2002 (JP) ............................ 2002-239732

(51) Int. Cl.
*H01L 27/10* (2006.01)

(52) U.S. Cl. ...................................................... 257/211

(58) Field of Classification Search ................. 257/211
See application file for complete search history.

(56) References Cited

U.S. PATENT DOCUMENTS

| | | | | |
|---|---|---|---|---|
| 5,241,205 | A | 8/1993 | Shimizu et al. | 257/368 |
| 5,399,517 | A | 3/1995 | Ashtaputre et al. | 438/598 |
| 5,723,908 | A * | 3/1998 | Fuchida et al. | 257/758 |
| 6,150,700 | A | 11/2000 | Lee | 257/391 |
| 6,274,934 | B1 * | 8/2001 | Shirota | 257/758 |
| 6,404,019 | B1 | 6/2002 | Reith et al. | 257/368 |
| 6,559,485 | B2 * | 5/2003 | Aoyama | 257/211 |
| 6,649,945 | B1 * | 11/2003 | Hosono et al. | 257/210 |
| 2003/0189224 | A1 * | 10/2003 | Ohsaki et al. | 257/211 |

FOREIGN PATENT DOCUMENTS

| | | |
|---|---|---|
| JP | 2001-110810 | 4/2001 |
| JP | 2002-031833 | 1/2002 |

* cited by examiner

*Primary Examiner*—Howard Weiss
(74) *Attorney, Agent, or Firm*—Hogan & Hartson, L.L.P.

(57) ABSTRACT

Bit lines are arranged with minimum width and minimum space in a chip, and each bit line is given a maximum of first potential difference. The minimum space is the value which will not make a line short-circuit in a line due to dielectric strength, when the first potential difference is applied across the bit lines. This value may be the design rule or the minimum dimensions capable of being processed by lithography. A second potential difference lager than the first potential difference is applied across a shielded power line and the bit lines. The shielded power line is not adjacent to the bit lines in the wiring width direction in the area where the bit lines are arranged with the minimum space.

32 Claims, 8 Drawing Sheets

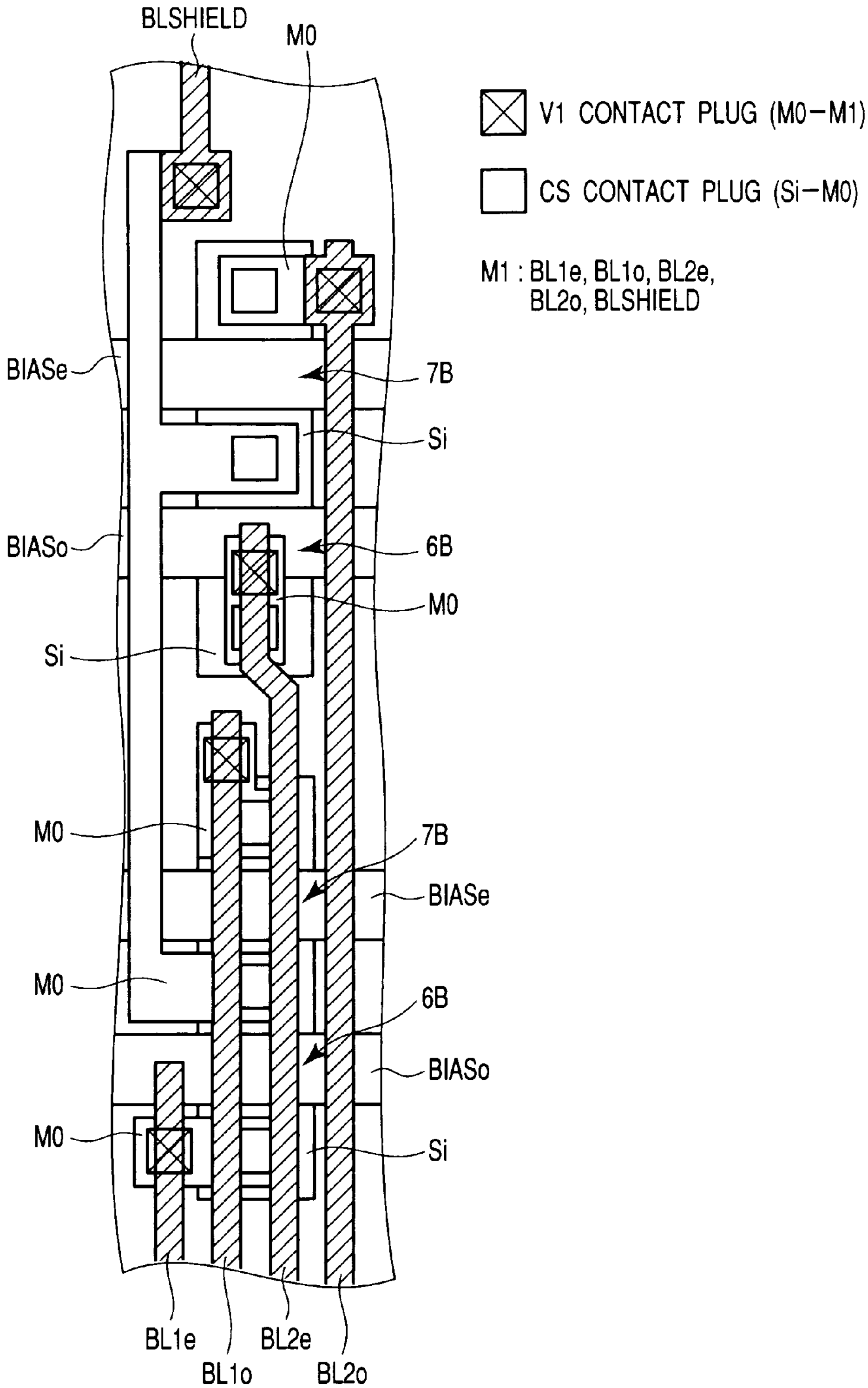
F I G. 8

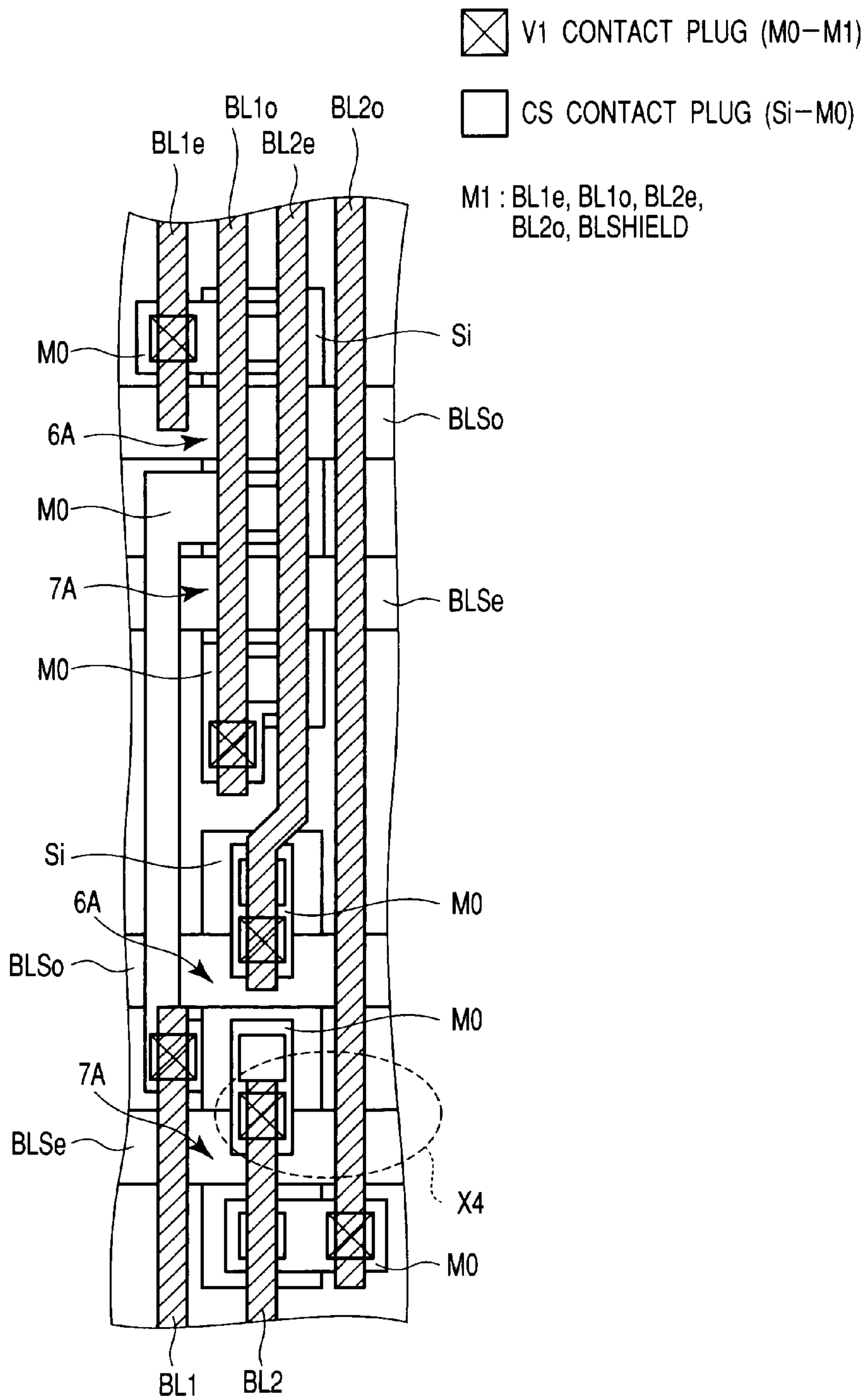
F I G. 10

NAND FLASH MEMORY WITH UNEQUAL SPACING BETWEEN SIGNAL LINES

CROSS-REFERENCE TO RELATED APPLICATIONS

This is a continuation of application Ser. No. 10/274,438 filed Oct. 18, 2002, now U.S. Pat. No. 6,649,945, which application is hereby incorporated by reference in its entirety. This application is based upon and claims the benefit of priority from the prior Japanese Patent Application No. 2002-239732, filed Aug. 20, 2002, the entire contents of which are incorporated herein by reference.

BACKGROUND OF THE INVENTION

1. Field of the Invention

The present invention relates to a wiring layout to weaken an electric field generated between the lines exposed to a high voltage, particularly to the bit lines of a nonvolatile semiconductor memory.

2. Description of the Related Art

First of all, the prior art of the present invention will be explained taking a NAND flash memory, a kind of nonvolatile semiconductor memory, as an example.

FIG. 1 shows an example of a cell array of a NAND flash memory. In this example, only one NAND block (erase unit) is shown to simplify the explanation.

A NAND flash memory is a kind of electrically rewritable nonvolatile semiconductor memory. A NAND block represents an erase unit, and all the data in the memory cell of a NAND block is erased simultaneously. A NAND block has a plurality of NAND cell units 1. These NAND cell units 1 are placed in a cell's P-well area, CPWELL, for example.

A NAND cell unit comprises a NAND string comprising a plurality of memory cells 2 connected in series, one select gate transistor 3 connected to one end of the NAND series, and another select gate transistor 3 connected to another end of the NAND series. The one select gate transistor 3 connected to the one end of the NAND series is connected to a common source line CELSRC, and the another select gate transistor 3 connected to the another end of the NAND series is connected to bit lines BL1*e*–BLne and BL1*o*–BLno.

Word lines WL 0, WL 1 to WL 15 are connected to the memory cells 2 in the NAND cell unit, and they function as control gate electrodes of the memory cells 2. Select gate lines SGS and SGD are connected to the select gate transistors 3 in the NAND cell unit 1, and they function as gate electrodes of the select gate transistors 3.

In this example, a sense amplifier (S/A) 4 employs a cell array structure with two bit lines BLie and BLio (i=1, 2, to n) connected through a select circuit 5A. Two bit lines BLie and BLio are connected to a shielded power line BLSHIELD through a select circuit 5B. With this structure, a so-called shielded bit line reading method can be used upon reading operation.

Namely, since the N-channel MOS transistor 6A turns on when the control signal BLSe is "H" and the control signal BLSo is "L", the even-numbered bit line BLie is electrically connected to the sense amplifier 4. As the control signal BIASe becomes "L" and the control signal BIASo becomes "H" at this time, the N-channel MOS transistor 7B is ON and the shielding potential VSHIELD (e.g., 0V) is supplied to the odd-numbered bit line BLio.

Further, since the N-channel MOS transistor 7A turns on when the control signal BLSe is "L" and the control signal BLSo is "H", the odd-numbered bit line BLio is electrically connected to the sense amplifier 4. As the control signal BIASe becomes "H" and the control signal BIASo becomes "L" at this time, the N-channel MOS transistor 6B is ON and the shielding potential VSHIELD (e.g., 0V) is supplied to the even-numbered bit line BLie.

It is noted here that the even and odd numbers are determined by the bit line numbers counted from left to right assuming the leftmost bit line to be 0.

Since all bit lines BL1*e*, . . . BLne; BL1*o*, . . . BLno become high potential (erase potential) upon erasing, the N-channel MOS transistors 6A, 6B and 7A, 7B in the select circuits 5A and 5B, respectively, consist of high voltage MOS transistors.

In a NAND flash memory, during writing and erasing, electric charge is injected into/ejected from the floating gate electrode by an FN tunnel current.

During the writing operation, 20V is applied to the selected word line WLj and 0V is applied to the cell's P-well area (the memory cell channel) CPWELL, for example.

During the erasing operation, 0V is applied to the word line WL0, WL1 to WL15 in the selected NAND block, and 20V is applied to the cell's P-well area (channel of memory cell) CPWELL, for example.

When erasing, all bit lines BL1*e*–BLne and BL1*o*–BLno are actually floating.

However, when 20V is applied to the cell's P-well area CPWELL, a forward bias diode (cell's P-well area+N-type diffusion layer) is connected between the cell's P-well area CPWELL and the bit lines BL1*e*–BLne and BL1*o*–BLno. As a result, the bit lines BL1*e*–BLne and BL1*o*–BLno are also charged to about 20V.

As described above, during writing or erasing, the selected word line WLj or all the bit lines BL1*e*–BLne and BL10–BLno are charged to about 20V. Therefore, as a potential difference between these lines and other lines increases, a dielectric breakdown occurs between these lines, and a line short-circuit problem arises.

Particularly, in recent years, the cell array has become finer and the wiring design rule has become narrower. This increases the possibility of short-circuit due to an intense electric field in and in the proximity of a cell array.

Hereinafter, the problem will be discussed in detail taking bit lines of a nonvolatile semiconductor memory, as an example.

FIG. 2 shows a wiring layout of the part indicated as the area B in FIG. 1. FIG. 3 shows an equivalent circuit diagram of the layout of FIG. 2.

The bit lines BL1*e*, BL1*o*, BL2*e*, BL2*o* are arranged as metal lines M1 with minimum width and minimum space in a memory chip.

The above-mentioned minimum width means the minimum width determined by the processing technique of lithography. The minimum space means the minimum space S1 which is influenced by the lithography technique, but in principle makes no short-circuit in the lines due to dielectric breakdown when a voltage (potential difference) V1 is generated between the lines.

The bit lines BL1*e* and BL2*e* are connected to the N-type drain diffusion layer of the N-channel MOS transistor 6B through the V1 contact plug, metal line M0 and CS contact plug. The bit lines BL1*o* and BL2*o* are connected to the N-type drain diffusion layer of the N-channel MOS transistor 7B through the V1 contact plug, metal line M0 and CS contact plug.

The shielded power line BLSHIELD is connected to the N-type source diffusion layers of N-channel MOS transistors 6B and 7B through a V1 contact plug, a metal line M0 and a CS contact plug.

The metal line M0 means the lines in the lowest layer which are directly connected to a silicon substrate (e.g., a N-type diffusion layer) Si using a CS contact plug without passing through other metal lines. The metal line M1 means the lines in one layer above M0.

The gate electrodes of the N-channel MOS transistors 6B and 7B are made of conductive polysilicon film containing impurities, for example.

In the wiring layout of this example, since the bit lines BL1*e*, BL1*o*, BL2*e*, BL2*o* are arranged with minimum width and minimum space, a fringe is not given to the bit lines BL1*e*, BL1*o*, BL2*e*, BL2*o* in the contact area (above the V1 contact plug). Further, the size of the V1 contact plug is larger than the width of the bit lines BL1*e*, BL1*o*, BL2*e*, BL2*o*.

Therefore, the space between the bit lines BL1*e*, BL1*o*, BL2*e*, BL2*o* and the V1 contact plug becomes smaller than the minimum space where no dielectric breakdown occurs between the lines.

Specifically, in the example shown in FIGS. 2 and 3, the space between the bit line BL1*o* and the V1 contact plug in the area X1 becomes smaller than the minimum space. The space between the shielded power line BLSHIELD and the V1 contact plug in the area X2 is also reduced to be smaller than the minimum space.

As a result, an electric field concentrates on these reduced areas, and a dielectric breakdown occurs, spoiling the reliability of the nonvolatile semiconductor memory.

Further, in the wiring layout of this example, the bit lines BL1*e*, BL1*o*, BL2*e*, BL2*o* are arranged with minimum width and minimum space, and the space between the shielded power supply BLSHIELD and the bit lines BL1*e*, BL1*o*, BL2*e*, BL2*o* is set to be minimum.

However, it is to be noted that this minimum space is determined by the voltage V1 impressed across the bit lines BL1*e*, BL1*o*, BL2*e*, BL2*o*. Namely, a voltage larger than V1 may be applied to between the shielded power line BLSHIELD and the bit lines BL1*e*, BL1*o*, BL2*e*, BL2*o*.

In this case, a line short-circuit occurs due to concentration of electric field between the shielded power line BLSHIELD and the bit lines BL1*e*, BL1*o*, BL2*e*, BL2*o*, failing to ensure the reliability of the nonvolatile semiconductor memory.

FIG. 4 shows signal waveforms upon erasing.

At the time t1 to t3, 20V is applied as an erasing voltage to the cell's P-well area CPWELL. The bit lines BL1*e*, BL1*o*, BL2*e*, BL2*o* are charged to about 20V, specifically 20V−Vf. (Vf is the forward bias voltage between the cell's P-well area and N-type diffusion layer.) The shielded power line BLSHIELD is charged to Vcc (approx. 3V, for example).

Therefore, during the erase operation, a potential difference of 20V−Vcc occurs between the bit line BL1*o* and the shielded power line BLSHIELD in FIG. 2, for example.

Particularly, in the areas X1 and X2, the space between the bit line BL1*o* and the shielded power line BLSHIELD is narrower than the minimum space. Further, considering contact holes, line shifts or uneven shapes occurred during the lithography, the space between the bit line BL1*o* and the shielded power line BLSHIELD may be reduced further.

Therefore, there is a very large possibility of line short-circuit due to concentration of electric field on the area between the shielded power line BLSHIELD and the bit lines BL1*e*, BL1*o*, BL2*e*, BL2*o*.

A short-circuit in a line causes leakage of the electric charge on erasing from the cell's P-well area to the bit line BL1*o*, for example and further to the shielded power line BLSHIELD, failing to supply the cell's P-well area with the voltage large enough to do the erase operation.

This will result in defective erasing, lowering the reliability of the nonvolatile semiconductor memory.

As explained above, as the design rule becomes very small with the finer element, the possibility of a short-circuit between the lines exposed to high voltage increases. This has been the problem in the prior art.

BRIEF SUMMARY OF THE INVENTION

A NAND flash memory according to an aspect of the present invention comprises a NAND memory cell array having a NAND block which comprises NAND memory cells; first and second lines arranged in the NAND block with a first interval, connected to the NAND memory cells; and third and fourth lines arranged in the NAND block with a second interval wider than the first interval; wherein the first interval is a minimum interval less than 0.12 μm, and a maximum value of a voltage generated between the third and fourth lines is greater than a maximum value of a voltage generated between the first and second lines.

BRIEF DESCRIPTION OF THE SEVERAL VIEWS OF THE DRAWING

FIG. 8 is a plane view showing a wiring layout according to a first embodiment of the present invention;

FIG. 10 is a plane view showing a wiring layout according to a second embodiment of the present invention;

DETAILED DESCRIPTION OF THE INVENTION

Description will be given on a semiconductor device according to an aspect of the present invention hereinafter with reference to the accompanying drawings.

1. Concept (1) Concept 1

Figure 5:
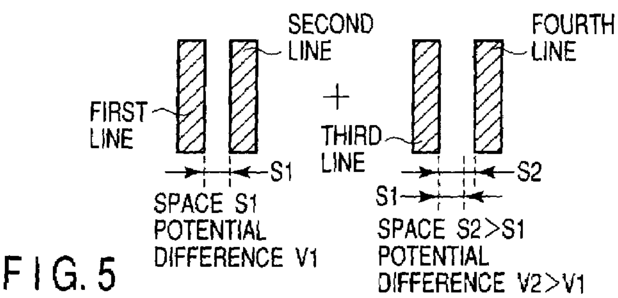
FIG. 5 is a view showing a first concept of the present invention.

FIG. 5 is a view showing a first concept of the present invention.

It is assumed that first and second lines are formed on the same wiring layer, and a potential difference of V1 maximum is applied across these two lines. A space S1 between the first and second lines is set to a value that will not make a short-circuit in a line due to dielectric breakdown when at least the potential difference V1 is applied across the first and second lines.

This value may be a minimum value that will not make a short-circuit in a line due to dielectric breakdown when a potential difference V1 is applied across the first and second lines, or it may be a value in accordance with the lithography technique.

Here, the minimum value is assumed to be equivalent to the minimum dimension limited by the lithography technique or the design rule (the value lower than 0.12 μm) Namely, the space S1 is defined as a minimum value that will not make a line short-circuit due to dielectric breakdown when the potential difference V1 is applied across the first and second lines.

On the other hand, third and fourth lines are is assumed to be formed on the same wiring layer, and a potential difference of V2 maximum (>V1) is assumed to be applied across the third and fourth lines. The third and fourth lines may be formed on the same wiring layer as that of the first and second lines, or they may be formed on a different wiring layer.

In this case, the space S2 between the third and fourth lines is set larger than the space S1, specifically the value that will not make a line short-circuit due to dielectric breakdown when at least the potential difference V2 is applied across the third and fourth lines. More specifically, the space S2 is set to the minimum value or larger that will not make a line short-circuit due to dielectric breakdown when the potential difference V2 is applied across the third and fourth lines.

(2) Concept 2

Figure 6:
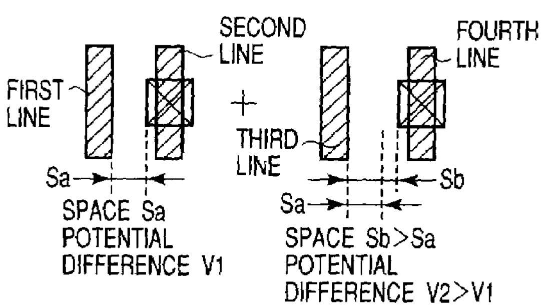
FIG. 6 is a view showing a second concept of the present invention.

FIG. 6 is a view showing a second concept of the present invention.

It is assumed that first and second lines are formed on the same wiring layer, and a potential difference of V1 maximum is applied across these two lines. A space between the first and second lines is set to the design rule (the value lower than 0.12 μm, for example) or the minimum value capable of being processed by lithography.

It is also assumed that the size of a contact plug is larger than the width of the second line. In this case, a space Sa between the first line and the contact plug is narrower than the space between the first and second lines (the design rule or the minimum processing value).

The space Sa between the first line and the contact plug is set to a value that will not make a line short-circuit due to dielectric breakdown when at least the potential difference V1 is applied across the first and second lines. Specifically, the space Sa is set to the minimum value that will not make a line short-circuit due to dielectric breakdown when the potential difference V1 is applied across the first and second lines.

On the other hand, third and fourth lines are assumed to be formed on the same wiring layer, and a potential difference of V2 maximum (>V1) is assumed to be applied across these two lines. The third and fourth lines may be formed on the same wiring layer as that of the first and second lines, or they may be formed a different wiring layer.

In this case, a space Sb between the third line and the contact plug is set larger than the space Sa, or the value that will not make a line short-circuit due to dielectric breakdown when a potential difference V2 is applied across the third and fourth lines. More specifically, the space Sb is set to the minimum value or larger that will not make a line short-circuit due to dielectric breakdown when the potential difference V2 is applied across the third and fourth lines.

(3) Concept 3

Figure 7:
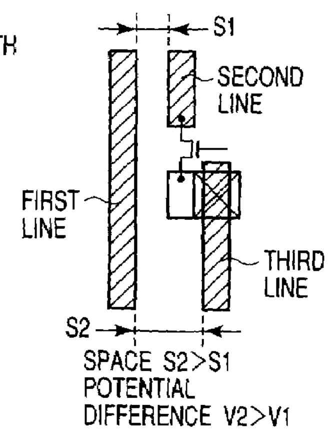
FIG. 7 is a view showing a third concept of the present invention.
Figure 4:
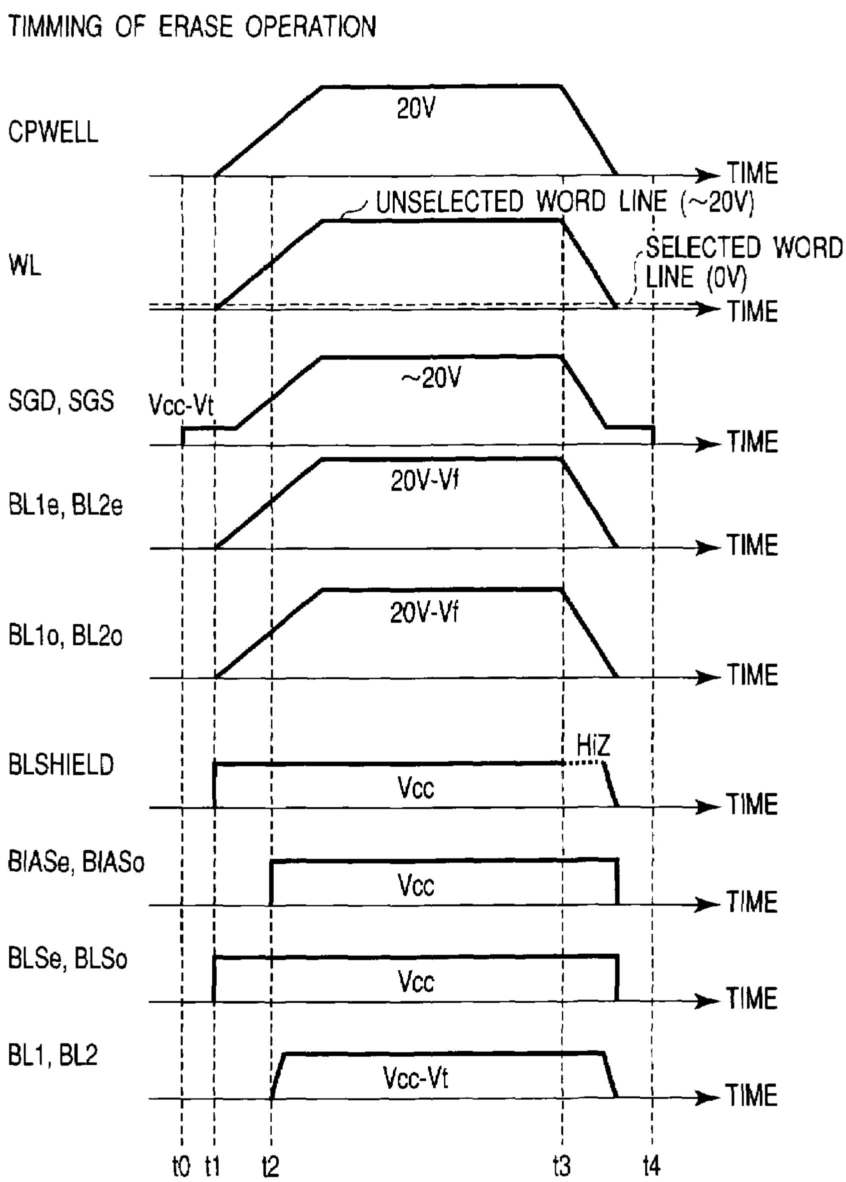
FIG. 4 shows waveforms indicating the timing of erase operation.

FIG. 7 is a view showing a third concept of the present invention.

It is assumed that first and second lines are formed on the same wiring layer, and a potential difference of V1 maximum is applied across these two lines. A space S1 between the first and second lines is set to a value that will not make a line short-circuit when a potential difference of at least V1 is applied across the first and second lines. This value is equivalent to the design rule (the value lower than 0.12 μm, for example) or the minimum value capable of being processed by lithography.

On the other hand, a third line is assumed to be formed on the same wiring layer as that of the first and second layers, and a potential difference of V2 maximum (>V1) is assumed to be applied across the first and third lines. In this case, a space S2 between the first and third line is set larger than the space S1, specifically, the minimum value or larger that will not make a line short-circuit due to dielectric breakdown when at least the potential difference V2 is applied across the first and third lines.

It is to be noted that the second and third lines are connected by a high voltage MOS transistor.

(4) Numerical Value Example

The concept 1 relates to a wiring layout to determine the space S2 between the third and fourth lines, when the space S1 between the first and second lines has been determined. The concept 3 relates to the layout to determine the space S2 between the first and third lines, when the space S1 between the first and second lines was already determined.

In the concepts 1 and 3, the expression E (Electric field)=V1/S1=V2/S2 is established between the spaces S1 and S2.

The concept 2 relates to a wiring layout to determine the space Sb between the third line and the contact plug, when the space Sa between the first line and the contact plug was already determined.

In the concept 2, the expression E (Electric field)=V1/Sa=V2/Sb is established between the spaces S1 and S2.

The values of S1, S2, Sa and Sb can be simulated based on the above expressions.

For example, if V1 is fixed to 3.6V and V2 is fixed to 20V, S2 becomes 0.56 μm when S1 is 0.1 μm. If S1 is 0.09 μm, S2 becomes 0.50 μm. If S1 is 0.05 μm, S2 becomes 0.28 μm. If S1 is 0.03 μm, S2 becomes 0.167 μm. If S1 is 0.025 μm, S2 becomes 0.14 μm.

It is to be noted that these numerical values S1, S2, Sa and Sb actually mean the wiring spaces after completion of wiring and processing. During wiring and processing, unexpected conditions such as shifts in aligning a mask may occur. Namely, there will be a certain transformation difference between the design wiring intervals (the sizes when making a layout pattern) S1', S2', Sa', Sb' before the wiring/processing, and the actual intervals after the wiring/processing.

Therefore, the design wiring intervals S1', S2', Sa', Sb' shall be determined by taking account of the transformation difference.

(5) Summary

As explained above, the space S1 or Sb that is to be the narrowest space, or the value of the space S2 or Sb between the third and fourth lines or between the first and third lines, is determined based on the maximum potential differences V1 and V2 generated between the first and second lines and between the third and fourth lines.

The space value determined as above facilitates the layout of the third and fourth lines or the first and third lines to which a high voltage V2 is applied, and thereby ensures reliability of a semiconductor device in operation with a high voltage.

2. Embodiments

Hereinafter, details of preferable embodiments of the present invention will be explained.

(1) Embodiment 1

Figure 9:
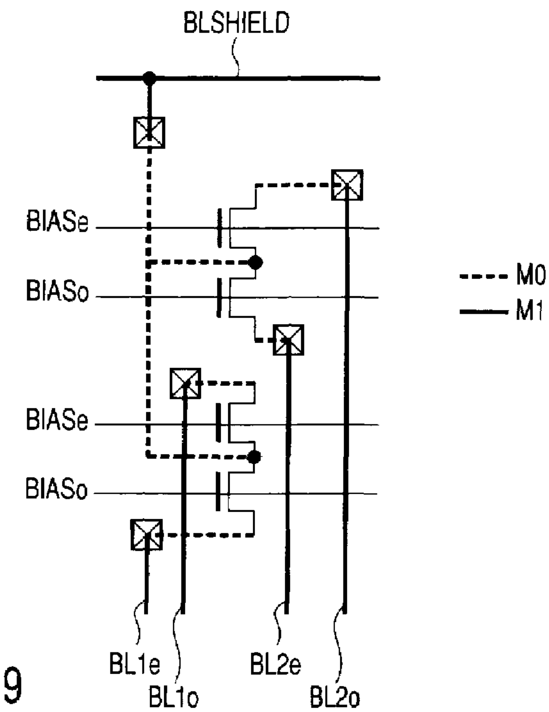
FIG. 9 is a circuit diagram substituting for the layout of FIG. 8.

FIG. 8 is a plane view showing a wiring layout according to a first embodiment of the present invention. FIG. 9 is a circuit diagram substituting for the layout of FIG. 8.

Figure 1:
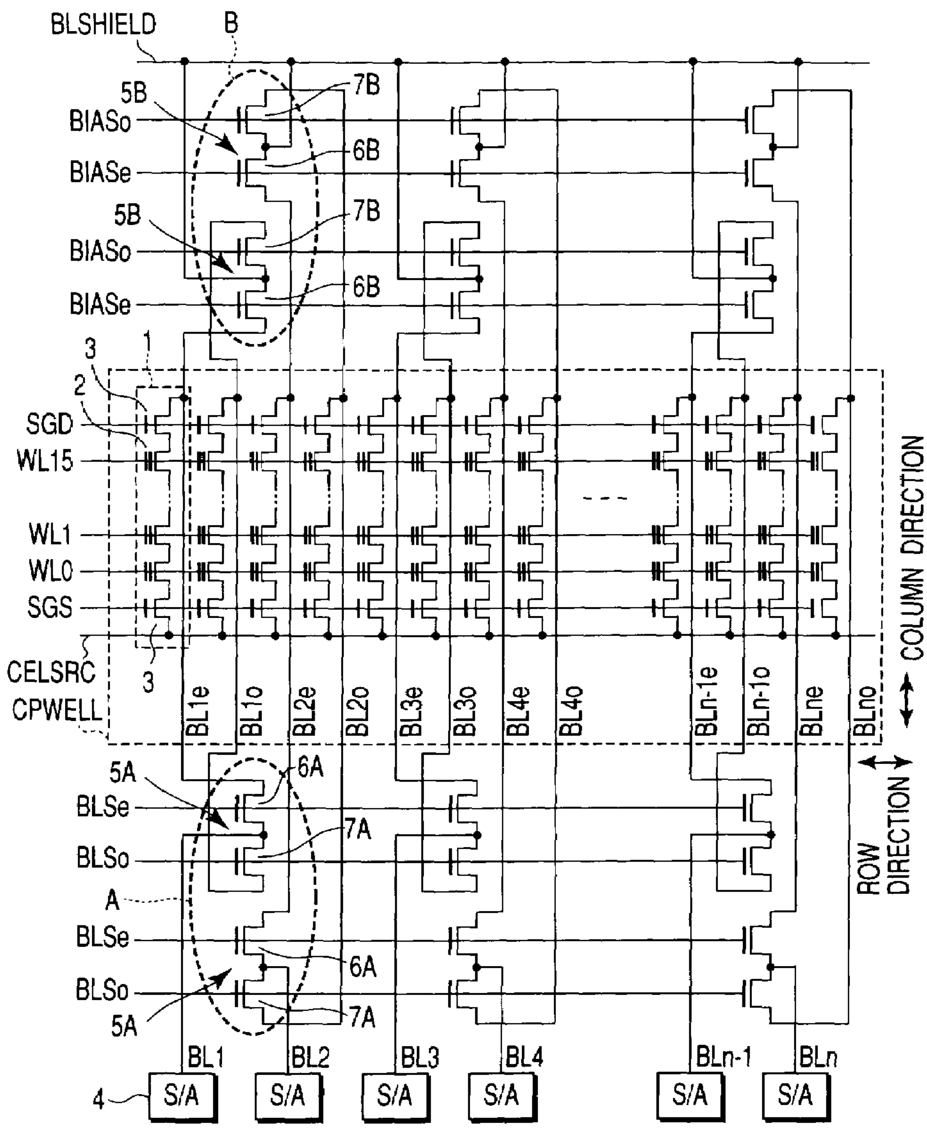
FIG. 1 is a circuit diagram of a cell array of a NAND flash memory.
Figure 2:
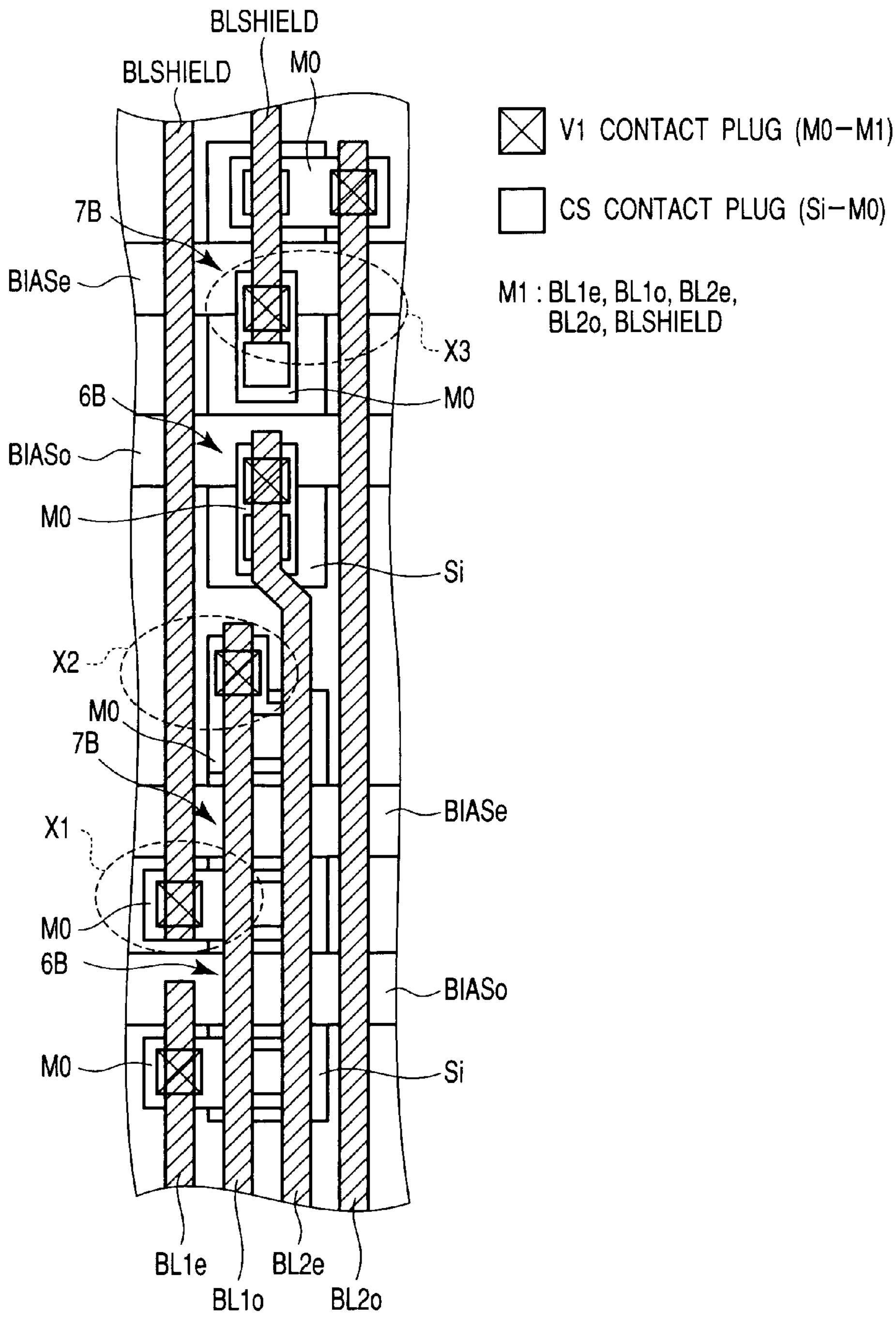
FIG. 2 is a plane view of a conventional wiring layout.
Figure 3:
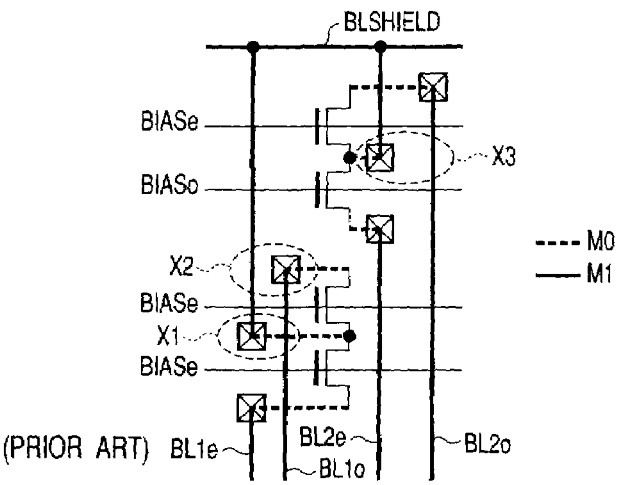
FIG. 3 is a circuit diagram substituting for the layout of FIG. 2.

The layout of FIG. 8 corresponds to the part B in FIG. 1, and is a modification of the conventional layout of FIG. 2.

Each of the N-channel MOS transistors 6B and 7B, as a select circuit, has the function of selecting a bit line to apply a shielding potential VSHIELD, and at the same time, it has the function of preventing transmission of the potential (approx. 20V) of the bit lines BL1e, BL1o, BL2e, BL2o to the shielded power line BLSHIELD, upon erase operation.

It is very difficult to prevent the transmission of the charge from the cell's P-well area CPWELL to the bit lines BL1e, BL1o, BL2e, BL2o, during the erase operation. On the other hand, the shielded power line BLSHIELD is charged to about a power supply potential Vcc (e.g., 3V) during the erase operation.

Therefore, it is necessary to separate the shielded power line BLSHIELD (including the V1 contact plug) sufficiently from the bit lines BL1e, BL1o, BL2e, BL2o (including the V1 contact plug) formed on the same wiring layer, to weaken the electric field generated therebetween. It is preferable not to adjacent the shielded power line BLSHIELD to the bit lines BL1e, BL1o, BL2e, BL2o in the width direction of the wiring.

For this purpose, this embodiment fully utilizes a metal line M0 laid just under the shielded power line BLSHIELD, and a metal line M1 as bit line BL1e, BL1o, BL2e, BL2o.

As seen from FIG. 1, all the select circuits 5B (N-channel MOS transistors 6B and 7B) of the shielded power line BLSHIELD side are commonly connected to the shielded power line BLSHIELD.

Thus, in this embodiment, the sources of the N-channel MOS transistors 6B and 7B in a plurality of (e.g., two) select circuits 5B are commonly connected by a metal line M0, and this metal line M0 is extended up to the area where none of bit lines BL1e, BL1o, BL2e, BL2o exists. And, in this area, the metal line M0 is connected to the shielded power line BLSHIELD (the metal line M1) by the V1 contact plug.

This realizes the wiring layout where the shielded power line BLSHIELD (including the V1 contact plug) is not adjacent, in the wiring width direction, to the bit lines BL1e, BL1o, BL2e, BL2o (including the V1 contact plug) formed on the same wiring layer.

Therefore, the shielded power line BLSHIEDL can be formed sufficiently isolated from the bit lines BL1e, BL1o, BL2e, BL2o on the same wiring layer, thereby ensuring the reliability of a semiconductor device in high-voltage operation.

It is also necessary for prevention of a line short-circuit due to dielectric breakdown to take sufficient space between the metal line M0 provided as an intermediate layer to connect the N-channel MOS transistors 6B, 7B to the bit lines BL1e, BL1o, BL2e, BL2o, and the metal line M0 provided as an intermediate layer to connect the shielded power line BLSHIELD to the N-channel MOS transistors 6B, 7B.

(2) Embodiment 2

Figure 11:
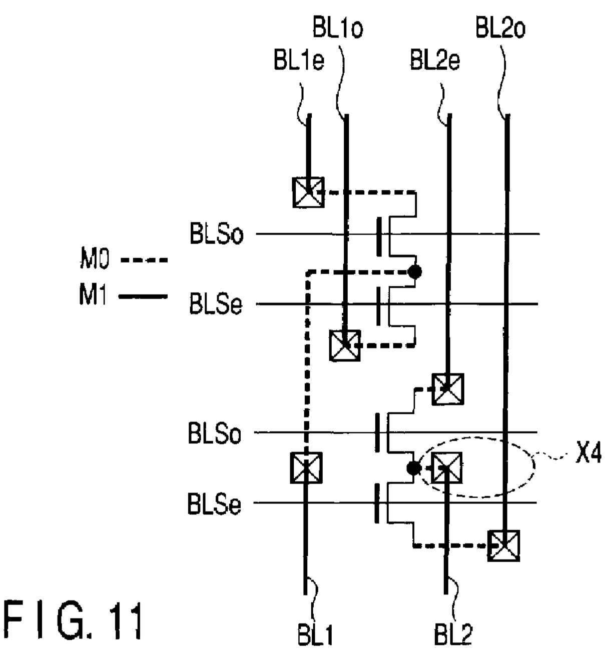
FIG. 11 is a circuit diagram substituting for the layout of FIG. 10.

FIG. 10 is a plane view showing a wiring layout according to a second embodiment of the present invention. FIG. 11 is an equivalent circuit diagram of the layout of FIG. 10.

The layout of FIG. 10 corresponds to the part A in FIG. 1.

Each of the N-channel MOS transistors 6A and 7A, as a select circuit, has the function of selecting a bit line to be connected to the sense amplifier S/A, and at the same time, it has the function of preventing transmission of the potential (approx. 20V) of the bit lines BL1e, BL1o, BL2e, BL2o to the sense amplifier S/A, upon erase operation.

It is very difficult to prevent the transmission of the charge from the cell's P-well area CPWELL to the bit lines BL1e, BL1o, BL2e, BL2o, during the erase operation. On the other hand, the gate potentials BLS2 and BLSo of the N-channel MOS transistors 6A and 7A, as a select circuit, are set to a power supply potential Vcc (e.g., 3V), and the potentials of the bit lines BL1 and BL2 before branching of the sense amplifier S/A side is set to about Vcc−Vt (Vt is the threshold voltage of MOS transistor), upon erase operation.

Therefore, it is necessary to separate the bit lines BL1 and BL2 (including the V1 contact plug) sufficiently from the bit lines BL1e, BL1o, BL2e, BL2o (including the V1 contact plug) formed on the same wiring layer, to weaken the electric field generated therebetween. For this purpose, this embodiment fully utilizes a metal line M0 laid just under the bit lines BL1 and BL2, and a metal line M1 as bit lines BL1e, BL1o, BL2e, BL2o.

As seen from FIG. 1, concerning the wiring layout of the bit lines BL1 and BL2, unlike the wiring layout of the shielded power line BLSHIELD, the select circuits 5A (N-channel MOS transistors 6A and 7A) must be independently connected to the sense amplifier S/A. Thus, in this embodiment 2, the sources of the N-channel MOS transistors 6A and 7A in a plurality of select circuits 5A cannot be commonly connected by a metal line M0.

Thus, in this embodiment, the metal lines M0 connected to the N-channel MOS transistors 6A and 7A are extended for each select circuit 5A up to the area where the bit lines BL1e, BL1o, BL2e, BL2o are coarsely arranged metal lines M1. And, in this area, the metal lines M0 are connected to the bit lines BL1 and BL2 (the metal lines M1) by the V1 contact plug.

It is more desirable that metal line M0 can be extended up to the area where none of bit lines BL1e, BL1o, BL2e, BL2o exists.

This realizes the wiring layout where the bit lines BL1 and BL2 before branching (including the V1 contact plug) are not adjacent in the wiring width direction to the bit lines BL1e, BL1o, BL2e, BL2o (including the V1 contact plug) formed on the same wiring layer.

Even if the bit lines BL1 and BL2 before branching are adjacent in the wiring width to the bit lines BL1e, BL1o, BL2e, BL2o, a sufficiently wide space is taken therebetween compared to the space between the bit lines BL1e, BL1o, BL2e, BL2o, as indicated by the area X4 in FIGS. 10 and 11.

Therefore, the bit lines BL1 and BL2 before branching (including the V1 contact plug) can be formed sufficiently isolated from the bit lines BL1e, BL1o, BL2e, BL2o on the same wiring layer, whereby the electric field between the lines can be weakened and the reliability of a semiconductor device can be ensured in high-voltage operation.

Further, since the bit lines BL1 and BL2 before branching and the bit lines BL1*e*, BL1*o*, BL2*e*, BL2*o* will not be shorted due to dielectric breakdown, a high voltage will not be applied to the MOS transistors in the sense amplifier S/A, and the gate or junction of the MOS transistors will not be broken.

It is also necessary for prevention of a line short-circuit due to dielectric breakdown to take sufficient space between the metal line M0 provided as an intermediate layer to connect the N-channel MOS transistors 6B, 7B to the bit lines BL1*e*, BL1*o*, BL2*e*, BL2*o*, and the metal line M0 provided as an intermediate layer to connect the bit lines BL1 and BL2 before branching to the N-channel MOS transistors 6A, 7A.

(3) Embodiment 3

Figure 12:
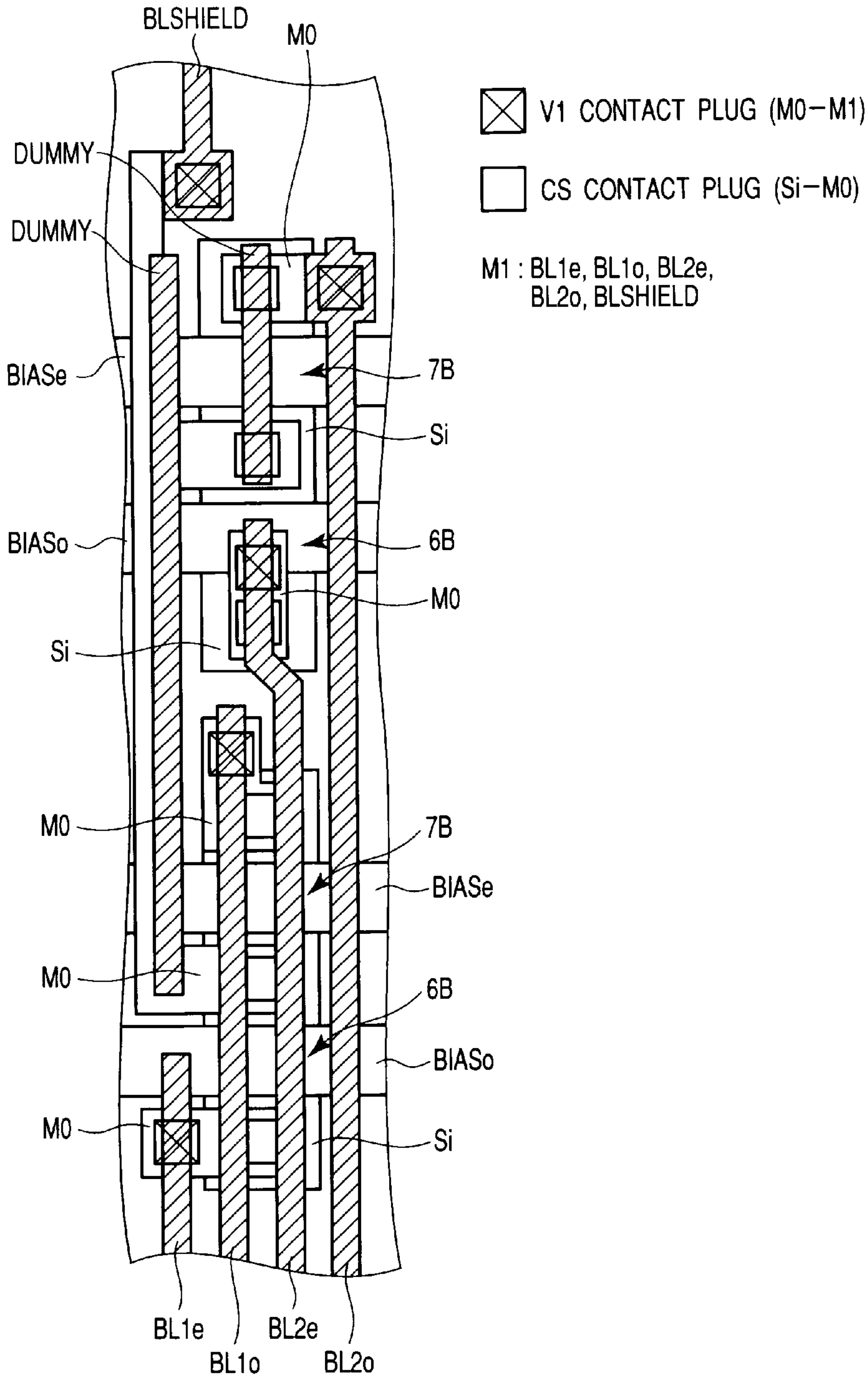
FIG. 12 is a plane view showing a wiring layout according to a third embodiment of the present invention.

FIG. 12 is a plane view showing a wiring layout according to a third embodiment of the present invention.

This wiring layout is a modification of the wiring layout of FIG. 8.

In the embodiment of FIG. 8, a wiring layer M0 is used to realize the layout where the shielded power line BLSHIELD is sufficiently separated from the bit lines BL1*e*, BL1*o*, BL2*e*, BL2*o* formed on the same wiring layer M1, to weaken the electric field therebetween. This achieves the objects of the present invention, eliminating an extremely narrow space between the lines and preventing a short-circuit due to dielectric breakdown between the lines.

However, in the embodiment of FIG. 8, the coarseness of the wiring pattern increases in the areas where the wiring width and space between lines are narrow. Thus, this layout is not optimum for lithography and processing of the wiring layer M1.

In this embodiment, a dummy pattern (a dummy line) DUMMY is laid in an empty space around the bit lines BL1*e*, BL1*o*, BL2*e*, BL2*o* formed on the wiring layer M1.

The space between the dummy pattern DUMMY and the bit lines BL1*e*, BL1*o*, BL2*e*, BL2*o* may be the same as the space between the bit lines BL1*e*, BL1*o*, BL2*e*, BL2*o*, or may be wider than that space.

The dummy pattern DUMMY put in an empty space around the bit lines BL1*e*, BL1*o*, BL2*e*, BL2*o* provides a good result in the lithography and processing of the wiring layer M1.

In the embodiment of FIG. 12, two dummy patterns DUMMY are made in the empty space around the bit lines BL1*e*, BL1*o*, BL2*e*, BL2*o*. These dummy patterns DUMMY are being floated, and not given a potential.

As described above, this embodiment achieves the primary object of the present invention to weaken the electric field generated between lines, and realizes a wiring layout with excellent processing accuracy.

3. Others

Although the present invention has been explained, taking an example of a NAND flash memory, the invention is applicable to other types of nonvolatile semiconductor memory.

Bit lines exposed to a high voltage are used in the embodiments of the invention, but the other lines such as word lines and ordinary lines can be used.

Moreover, the invention is applicable to semiconductor memories other than a nonvolatile memory, to the other types of semiconductor circuit, such as a logic LSI.

4. Effects

As explained hereinbefore, a semiconductor device according to an aspect of the present invention realizes a new wiring layout to weaken an electric field between the lines exposed to a high voltage, and ensures the reliability of a semiconductor in operation with a high voltage.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A NAND flash memory comprising:

a NAND memory cell array having a NAND block which comprises NAND memory cells;

first and second signal lines arranged in the NAND block with a first interval, connected to the NAND memory cells; and third and fourth signal lines arranged with a second interval wider than the first interval; wherein the first interval is a minimum interval less than 0.12 μm, and a maximum value of a voltage generated between the third and fourth signal lines is greater than a maximum value of a voltage generated between the first and second signal lines.

2. The NAND flash memory according to claim 1, wherein the second signal line is connected to a first contact plug having the width larger than that of the second signal line, and the distance between the first signal line and the first contact plug is narrower than the first interval.

3. The NAND flash memory according to claim 2, wherein the fourth signal line is connected to a second contact plug having the width larger than that of the fourth signal line, and the distance between the third signal line and the second contact plug is narrower than the second interval.

4. The NAND flash memory according to claim 3, wherein when the distance between the first signal line and the first contact plug is assumed to be Sa, the maximum value of the voltage generated between the first and second signal lines is assumed to be V1 and the maximum value of the voltage generated between the third and fourth signal lines is assumed to be V2, the distance Sb between the third signal line and the second contact plug is expressed by $Sb=(V2/V1)\times Sa$.

5. The NAND flash memory according to claim 1, wherein the first and second signal line and the third and fourth signal lines are formed on the same wiring layer.

6. The NAND flash memory according to claim 1, wherein the first and second signal line and the third and fourth signal lines are formed on a different wiring layer.

7. The NAND flash memory according to claim 1, wherein the first and second signal lines are word lines.

8. The NAND flash memory according to claim 1, wherein the first and second signal lines are bit lines.

9. The NAND flash memory according to claim 1, wherein when the first interval is assumed to be S1, the maximum value of the voltage generated between the first and second signal lines is assumed to be V1 and the maximum value of the voltage generated between the third and fourth signal lines is assumed to be V2, the second interval S2 is expressed by $S2=(V2/V1)\times S1$.

10. The NAND flash memory according to claim 1, wherein when a power supply potential is assumed to be Vcc, a ground potential is assumed to be Vss, an erase potential is assumed to be Vera and a forward bias voltage between a well area and a diffusion layer is assumed to be Vf, the maximum value Vmax1 of the voltage generated between the first and second signal lines is expressed by Vmax1=Vcc−Vss and the maximum value Vmax2 of the voltage generated between the third and fourth signal lines is expressed by Vmax2=(Vera−Vf)−Vcc.

11. A NAND flash memory comprising:

a NAND memory cell array having a NAND block which comprises NAND memory cells;

first and second signal lines arranged in the NAND block with a first interval, connected to the NAND memory cells;

a third signal line, wherein a second interval between the first and third signal lines is wider than the first interval; and a first transistor configured to connect the second and third signal lines; wherein the first interval is a minimum interval less than 0.12 μm, and a maximum value of a voltage generated between the first and third signal lines is greater than a maximum value of a voltage generated between the first and second signal lines.

12. The NAND flash memory according to claim 11, wherein the second signal line is connected to the first transistor through the wiring layer formed just under the second signal line, and the third signal line is connected to the first transistor through the wiring layer formed just under the third signal line.

13. The NAND flash memory according to claim 11, wherein the first and second signal lines are word lines.

14. The NAND flash memory according to claim 11, wherein the first and second signal lines are bit lines.

15. The NAND flash memory according to claim 11, wherein the third signal line is a line to give a predetermined potential to the second signal line, during read operation.

16. The NAND flash memory according to claim 11, wherein the third signal line is a line to connect the second signal line to a sense amplifier.

17. The NAND flash memory according to claim 11, wherein the transistor turns off, each of the first and second signal lines has an erase potential and the third signal line has a power supply potential, during erase operation.

18. The NAND flash memory according to claim 11, wherein when the first interval is assumed to be S1, the maximum value of the voltage generated between the first and second signal lines is assumed to be V1 and the maximum value of the voltage generated between the first and third signal lines is assumed to be V2, the second interval 52 is expressed by S2=(V2/V1)×S1.

19. The NAND flash memory according to claim 11, wherein when a power supply potential is assumed to be Vcc, a ground potential is assumed to be Vss, an erase potential is assumed to be Vera and a forward bias voltage between a well area and a diffusion layer is assumed to be Vf, the maximum value Vmax1 of the voltage generated between the first and second signal lines is expressed by Vmax1=Vcc−Vss and the maximum value Vmax2 of the voltage generated between the first and third signal lines is expressed by Vmax2=(Vera−Vf)−Vcc.

20. The NAND flash memory according to claim 11, wherein the second signal line is connected to a first contact plug having the width larger than that of the second signal line, and the distance between the first signal line and the first contact plug is narrower than the first interval.

21. The NAND flash memory according to claim 20, wherein the third signal line is connected to a second contact plug having the width larger than that of the third signal line, and the distance between the first signal line and the second contact plug is narrower than the second interval.

22. The NAND flash memory according to claim 21, wherein when the distance between the first signal line and the first contact plug is assumed to be Sa, the maximum value of the voltage generated between the first and second signal lines is assumed to be V1 and the maximum value of the voltage generated between the first and third signal lines is assumed to be V2, the distance Sb between the first signal line and the second contact plug is expressed by Sb=(V2/V1)×Sa.

23. The NAND flash memory according to claim 11, further comprising a second transistor connected to the first signal line; wherein the first and second transistors are arranged in being adjacent in the extending direction of the first and second signal lines.

24. The NAND flash memory according to claim 23, wherein the second transistor is connected to between the first and third signal lines.

25. A NAND flash memory comprising:

a NAND memory cell array having a NAND block which comprises NAND memory cells;

first and second signal lines arranged in the NAND block with a first interval, connected to the NAND memory cells;

a third signal line; and a first transistor configured to connect the second and third signal lines; wherein the first interval is a minimum interval less than 0.12 μm, and a maximum value of a voltage generated between the first and third signal lines is greater than a maximum value of a voltage generated between the first and second signal lines, and the third signal line is arranged at a position not adjacent to the first signal line.

26. The NAND flash memory according to claim 25, wherein the second signal line is connected to the first transistor through the wiring layer formed just under the second signal line, and the third signal line is connected to the first transistor through the wiring layer formed just under the third signal line.

27. The NAND flash memory according to claim 25, wherein the first and second signal lines are word lines.

28. The NAND flash memory according to claim 25, wherein the first and second signal lines are bit lines.

29. The NAND flash memory according to claim 25, wherein the third signal line is a line to give a predetermined potential to the second signal line, during read operation.

30. The NAND flash memory according to claim 25, wherein the third signal line is a line to connect the second signal line to a sense amplifier.

31. The NAND flash memory according to claim 25, wherein the transistor turns off, each of the first and second signal lines has an erase potential and the third signal line has a power supply potential, during erase operation.

32. The NAND flash memory according to claim 25, further comprising a fourth signal line arranged in being adjacent to at least one of the first, second and third signal lines; wherein the fourth signal line is a dummy line set to be floated its potential.

* * * * *